United States Patent
Yoshida et al.

(10) Patent No.: US 10,403,539 B2
(45) Date of Patent: Sep. 3, 2019

(54) ROBOT DIAGNOSING METHOD

(71) Applicants: KAWASAKI JUKOGYO KABUSHIKI KAISHA, Kobe-shi, Hyogo (JP); KAWASAKI ROBOTICS (USA), INC., Wixom, MI (US)

(72) Inventors: Tetsuya Yoshida, Kobe (JP); Ming Zeng, San Jose, CA (US); Hajime Nakahara, San Jose, CA (US); Antonio John Lozano, San Jose, CA (US); Tomozaku Arita, San Jose, CA (US)

(73) Assignees: KAWASAKI JUKOGYO KABUSHIKI KAISHA, Kobe (JP); KAWASAKI ROBOTICS (USA), INC., Wixom, MI (US)

( * ) Notice: Subject to any disclaimer, the term of this patent is extended or adjusted under 35 U.S.C. 154(b) by 230 days.

(21) Appl. No.: 15/669,665

(22) Filed: Aug. 4, 2017

(65) Prior Publication Data
US 2019/0043750 A1 Feb. 7, 2019

(51) Int. Cl.
| | |
|---|---|
| *H01L 21/00* | (2006.01) |
| *H01L 21/687* | (2006.01) |
| *H01L 21/67* | (2006.01) |
| *H01L 21/677* | (2006.01) |
| *H01L 21/68* | (2006.01) |

(52) U.S. Cl.
CPC .. *H01L 21/68707* (2013.01); *H01L 21/67259* (2013.01); *H01L 21/67766* (2013.01); *H01L 21/681* (2013.01)

(58) Field of Classification Search
USPC .......................... 700/245–264; 414/935–941
See application file for complete search history.

(56) References Cited

U.S. PATENT DOCUMENTS

| | | | | |
|---|---|---|---|---|
| 5,893,794 A | * | 4/1999 | Togawa | ............ H01L 21/67766 451/339 |
| 6,711,972 B1 | * | 3/2004 | Joyner | ................. B25H 1/0021 81/57.24 |
| 2003/0166383 A1 | * | 9/2003 | Kimura | ................... B24B 49/16 451/56 |
| 2006/0025890 A1 | * | 2/2006 | Nagatsuka | ............. B25J 9/1666 700/253 |
| 2009/0213347 A1 | * | 8/2009 | Sugihara | ............. G03F 7/70741 355/53 |

(Continued)

FOREIGN PATENT DOCUMENTS

| | | |
|---|---|---|
| JP | 2003-110004 A | 4/2003 |
| JP | 2009-049251 A | 3/2009 |

*Primary Examiner* — Jonathan L Sample
(74) *Attorney, Agent, or Firm* — Oliff PLC

(57) ABSTRACT

A robot diagnosing method detects a deviation amount caused by a lost motion and includes: a first step of preparing a robot including a robot arm having at least one joint portion, a work conveyed by the robot, and a prealigner including a processing portion configured to detect a center position of the work; and after the first to fifth steps, a sixth step of detecting the deviation amount caused by the lost motion at the one joint portion based on (i) the center position of the work based on the center position of the work detected in the second step and a command value from a robot control portion in the fourth step and (ii) the center position of the work detected in the fifth step.

8 Claims, 13 Drawing Sheets

(56) References Cited

U.S. PATENT DOCUMENTS

| | | | |
|---|---|---|---|
| 2012/0255794 A1* | 10/2012 | Fenske | G01G 19/00 |
| | | | 177/1 |
| 2014/0070752 A1* | 3/2014 | Otsuji | G05D 3/20 |
| | | | 318/603 |
| 2015/0165620 A1* | 6/2015 | Osaka | B25J 13/088 |
| | | | 700/250 |
| 2017/0018446 A1* | 1/2017 | Yin | H01L 21/68707 |
| 2017/0125272 A1* | 5/2017 | van Gogh | H01L 21/67161 |
| 2018/0141218 A1* | 5/2018 | Osaka | B25J 13/088 |
| 2018/0224500 A1* | 8/2018 | Thaulad | H01L 21/67253 |
| 2018/0269088 A1* | 9/2018 | Nozawa | H01L 21/67201 |

\* cited by examiner

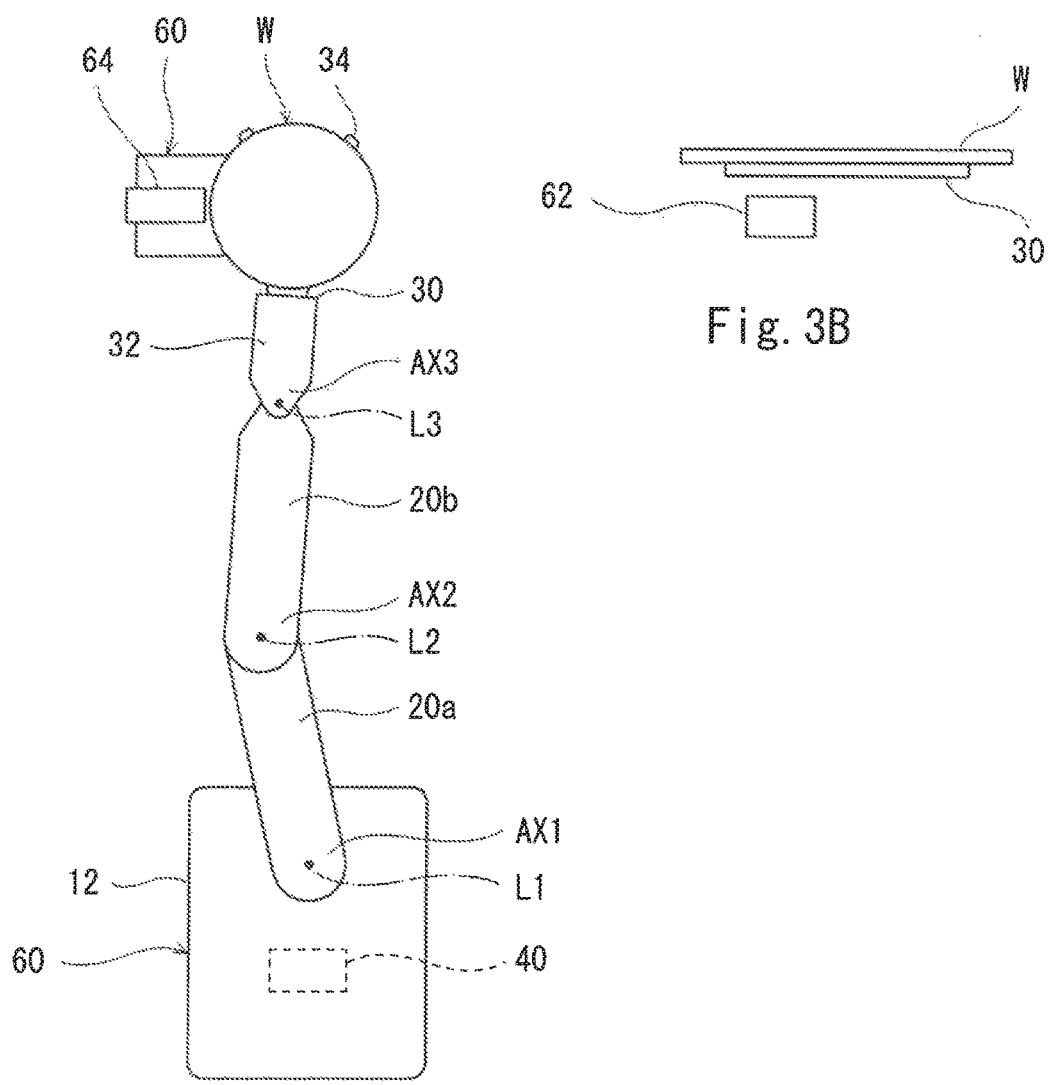

ROBOT DIAGNOSING METHOD

BACKGROUND OF THE INVENTION

Field of the Invention

The present invention relates to a robot diagnosing method, and particularly to a robot diagnosing method of detecting a deviation amount caused by a lost motion.

Description of Related Art

A robot diagnosing method of detecting a deviation amount caused by a lost motion has been known. Such diagnosing method is used for a wafer conveying apparatus described in the specification of Japanese Laid-Open Patent Application Publication No. 2009-49251.

The wafer conveying apparatus of the above publication repeatedly performs an operation of detecting a wafer at target positions that are arbitrary positions offset from a teaching command position, until the wafer moves out of a detection range of a wafer edge position detection sensor. Then, the wafer conveying apparatus stores the generated target positions and positions to which a transfer arm is actually moved. After all information pieces regarding X-direction and Y-direction positions from the teaching command position are collected, an arm drive control portion produces a correction table based on position errors that are differences between the target positions of the offset operations and the positions to which the transfer arm is actually moved and which are determined based on results of center positions of the wafer.

SUMMARY OF THE INVENTION

According to the above publication, the above-described complex procedure needs to be performed to detect the deviation amount caused by the lost motion. Therefore, that is a problem that the detection of the deviation amount requires labor and time.

An object of the present invention is to provide a robot diagnosing method capable of detecting, by a simple procedure, a deviation amount caused by a lost motion.

To solve the above problem, a robot diagnosing method according to the present invention is a robot diagnosing method of detecting a deviation amount caused by a lost motion, the robot diagnosing method including: a first step of preparing a robot including a robot arm having at least one joint portion, an end effector attached to the robot arm, and a robot control portion configured to control the robot arm and the end effector, a work conveyed by the robot, and a prealigner including a turn table on which the work is placed, a driving portion configured to rotate the turn table, a sensor configured to detect an outer edge portion of the work that is being rotated by the driving portion, and a processing portion configured to detect a center position of the work based on the outer edge portion detected by the sensor; a second step of placing the work on the turn table by the end effector and detecting the center position of the work by the prealigner; a third step of, after at least the first and second steps are performed, holding by the end effector the work placed on the turn table; a fourth step of, after at least the first and second steps are performed, rotating one of the at least one joint portion in a first direction by a predetermined angle based on a command value from the robot control portion; a fifth step of, after the first to fourth steps are performed, placing the work on the turn table by the end effector and detecting the center position of the work again by the prealigner; and a sixth step of, after the first to fifth steps are performed, detecting the deviation amount caused by the lost motion at the one joint portion based on (i) the center position of the work based on the center position of the work detected in the second step and the command value from the robot control portion in the fourth step and (ii) the center position of the work detected in the fifth step.

According to the above configuration, the deviation amount caused by the lost motion at one joint portion can be detected based on (i) the center position of the work based on the center position of the work detected in the second step and the command value from the robot control portion in the fourth step and (ii) the center position of the work detected in the fifth step. As a result, the deviation amount caused by the lost motion can be detected by a simple procedure.

The fourth step may be performed after the first to third steps are performed. With this, the effects of the present invention can be made significant.

For example, the robot diagnosing method may be designed such that: the third step is performed after the first, second, and fourth steps are performed; and in the fifth step, the end effector is returned to the same position as when the end effector places the work on the turn table in the second step, and the end effector then places the work on the turn table.

The robot diagnosing method may be designed such that: in the first step, an accommodating portion configured to accommodate the work is further prepared; in the second step, postures of the robot arm and the end effector are set by a predetermined first motion such that the work accommodated in the accommodating portion is holdable by the end effector, the end effector holds the work, the postures of the robot arm and the end effector are set by a predetermined second motion such that the work is placeable on the turn table, the work is then placed on the turn table, and the prealigner detects the center position of the work; in the fourth step performed after the first to third steps are performed, the postures of the robot arm and the end effector are set by the predetermined first motion such that the work is accommodatable in the accommodating portion, the work is accommodated in the accommodating portion, and one of the at least one joint portion is then rotated in the first direction by a predetermined angle based on the command value from the robot control portion; in the fifth step performed after the fourth step is performed, the end effector holds the work accommodated in the accommodating portion, the postures of the robot arm and the end effector are set by the predetermined second motion such that the work is placeable on the turn table, the work is then placed on the turn table, and the prealigner detects the center position of the work again; and in the sixth step performed after the first to fifth steps are performed, the deviation amount caused by the lost motion at the one joint portion when the postures are set such that the work is accommodatable in the accommodating portion is detected based on (i) the center position of the work based on the center position of the work detected in the second step and the command value from the robot control portion in the fourth step and (ii) the center position of the work detected in the fifth step.

According to the above configuration, the deviation amount caused by the lost motion when the postures are set such that the work is accommodatable in the accommodating portion can be detected.

The first direction in which the one joint portion is rotated in the fourth step may be opposite to a direction in which the one joint portion is rotated immediately before the work is placed on the turn table in the second step.

According to the above configuration, the deviation amount caused by the lost motion can be accurately detected.

In the first step, the work, the robot, and the prealigner may be prepared in a clean room that is a semiconductor manufacturing site.

According to the above configuration, without moving the work, the robot, and the prealigner from the clean room that is the semiconductor manufacturing site to outside, the deviation amount caused by the lost motion can be detected in the clean room. Therefore, the effects of the present invention in the clean room that is the semiconductor manufacturing site can be made significant.

In the first step, the accommodating portion may be prepared in the clean room that is the semiconductor manufacturing site.

According to the above configuration, without moving the work, the robot, the prealigner, and the accommodating portion from the clean room that is the semiconductor manufacturing site to outside, the deviation amount caused by the lost motion when the postures are set such that the work is accommodatable in the accommodating portion can be detected in the clean room.

For example, the work may be a semiconductor wafer.

BRIEF DESCRIPTION OF THE DRAWINGS

FIG. 1A is a plan view. FIG. 1B is a side view when a work and an end effector are viewed from a robot.

FIG. 2A is a plan view.

FIG. 2B is a side view when the work and the end effector are viewed from the robot.

FIGS. 3A and 3B are schematic diagrams for explaining third and fourth steps of the robot diagnosing method according to Embodiment 1 of the present invention. FIG. 3A is a plan view. FIG. 3B is a side view when the work and the end effector are viewed from the robot.

FIG. 4A is a plan view. FIG. 4B is a side view when the work and the end effector are viewed from the robot.

FIG. 5A is a partial plan view. FIG. 5B is a diagram showing a relation among center positions in the fourth step. FIG. 5C is a diagram showing the relation among the center positions in the fifth and sixth steps.

FIG. 6A is a plan view.

FIG. 6B is a side view when the work and the end effector are viewed from the robot.

FIG. 7A is a plan view.

FIG. 7B is a side view when the work and the end effector are viewed from the robot.

FIG. 8A is a plan view. FIG. 8B is a side view when the work and the end effector are viewed from the robot.

FIG. 9A is a plan view. FIG. 9B is a side view when the work and the end effector are viewed from the robot.

FIG. 10A is a partial plan view. FIG. 10B is a diagram showing the relation among the center positions.

FIG. 11A is a partial plan view. FIG. 11B is a diagram showing the relation among the center positions.

DETAILED DESCRIPTION OF THE PREFERRED EMBODIMENTS

1. Embodiment 1

Hereinafter, embodiments of the present invention will be explained in reference to the attached drawings. In the following explanations and drawings, the same reference signs are used for the same or corresponding components, and a repetition of the same explanation is avoided. A robot diagnosing method according to Embodiment 1 of the present invention will be explained based on FIGS. 1 to 5C. The robot diagnosing method according to Embodiment 1 of the present invention detects a deviation amount caused by a lost motion in a robot configured to perform operations in a clean room that is a semiconductor manufacturing site. It should be noted that the "deviation amount caused by a lost motion" widely denotes a deviation amount from an ideal motion of the robot. The "lost motion" is caused by backlash, torsion, or the like at each axis of a robot arm, but is not limited to this.

Figure 1:
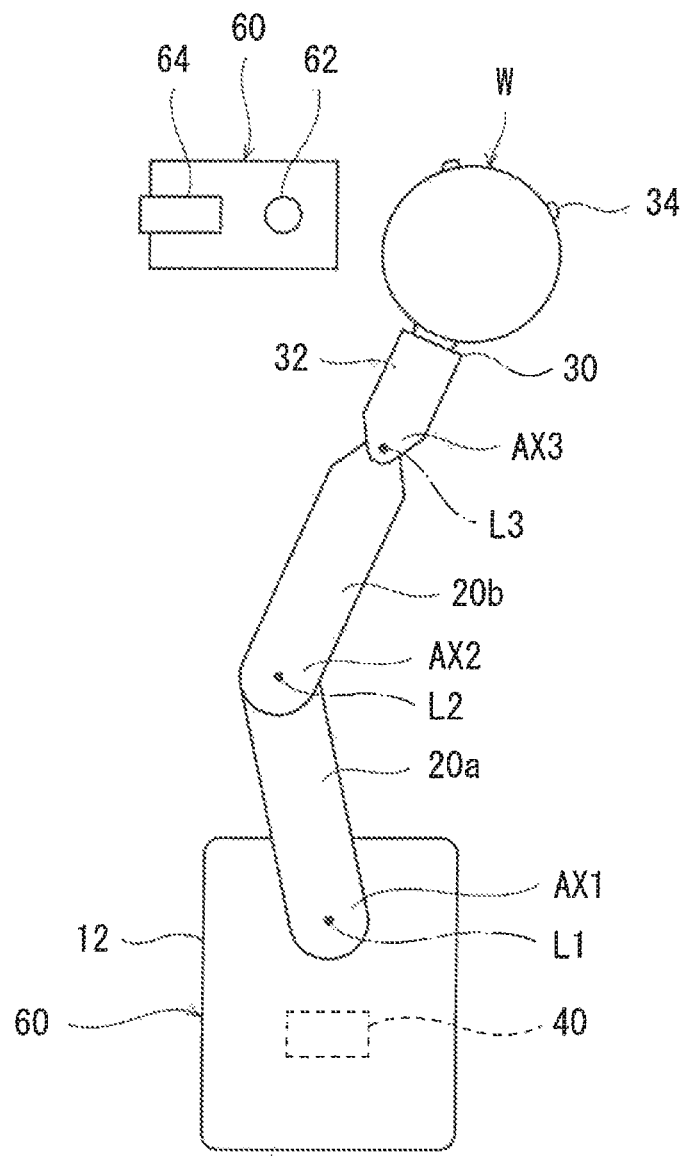
FIG. 1 is a schematic diagram for explaining a first step of a robot diagnosing method according to Embodiment 1 of the present invention.
Figures 2A, 2B:
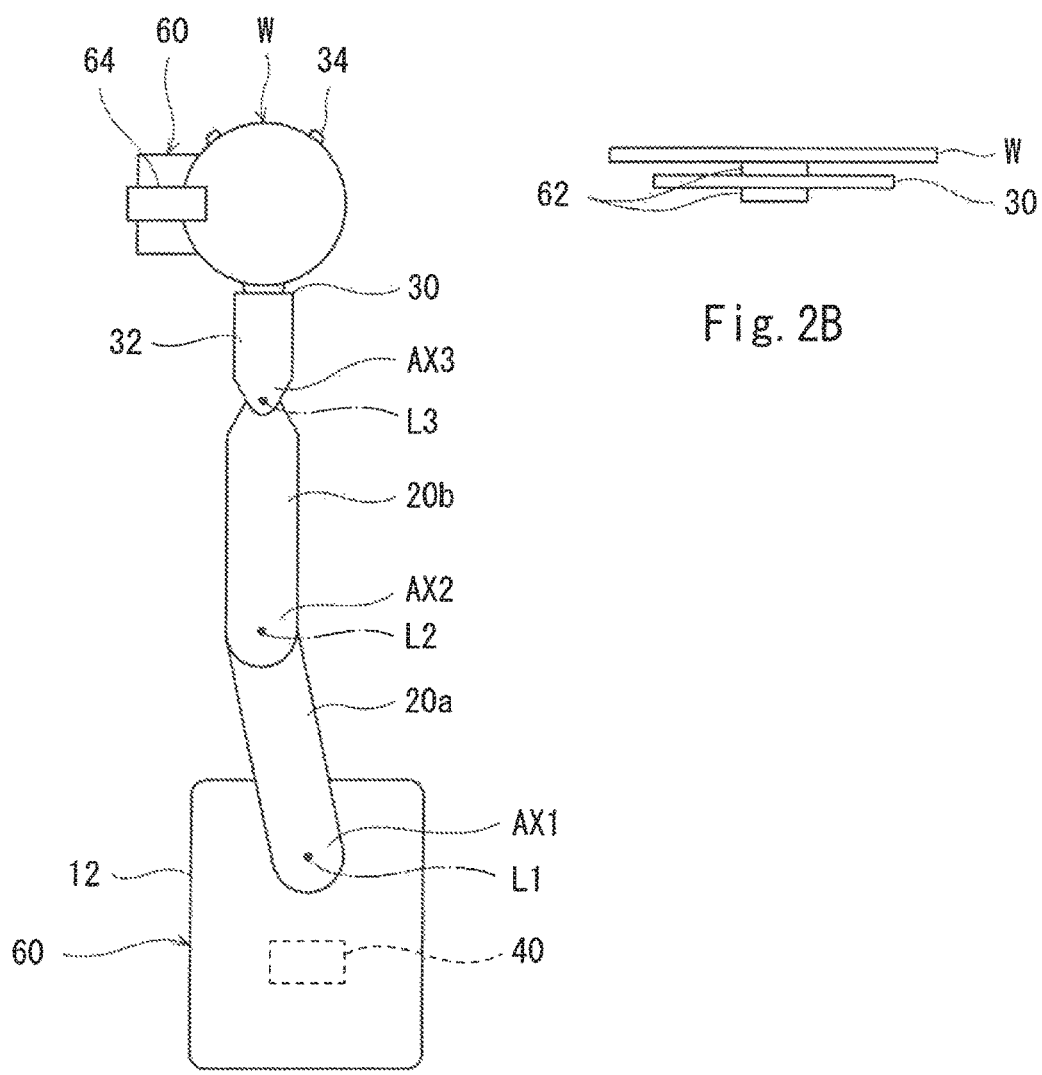
FIGS. 2A and 2B are schematic diagrams for explaining a second step of the robot diagnosing method according to Embodiment 1 of the present invention.
Figure 4B:
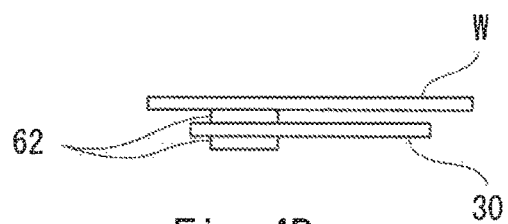
FIGS. 4A and 4B are schematic diagrams for explaining fifth and sixth steps of the robot diagnosing method according to Embodiment 1 of the present invention.
Figure 4A:
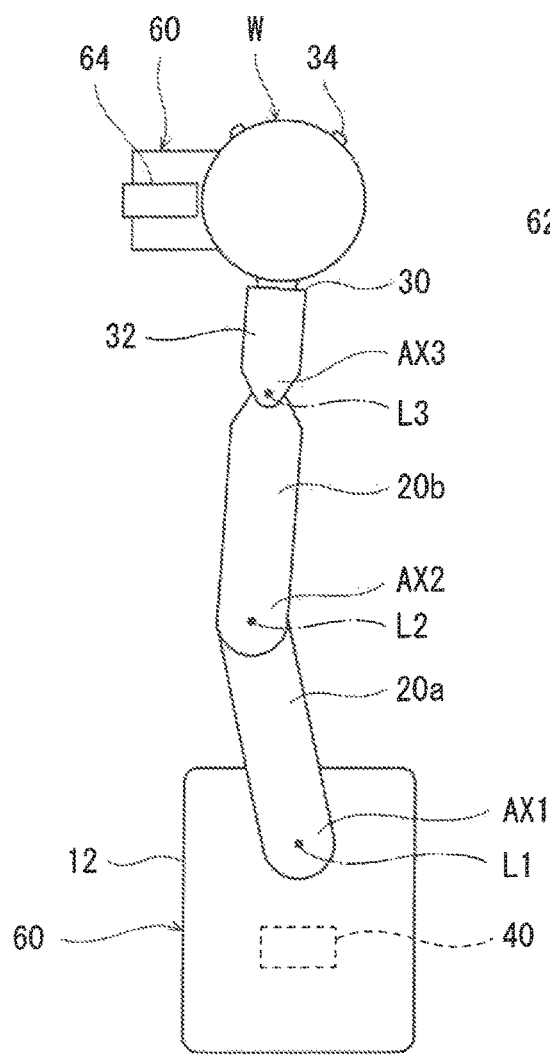
Figure 5A:
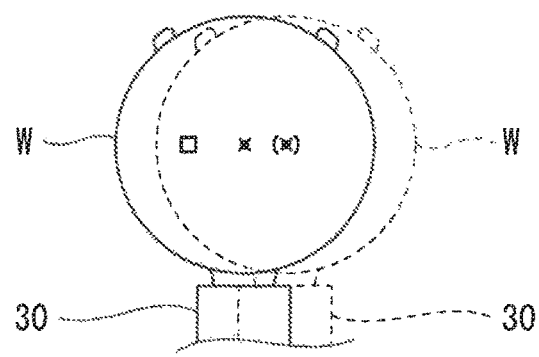
FIGS. 5A to 5C are schematic diagrams for explaining the fourth to sixth steps of the robot diagnosing method according to Embodiment 1 of the present invention.
Figure 5B:
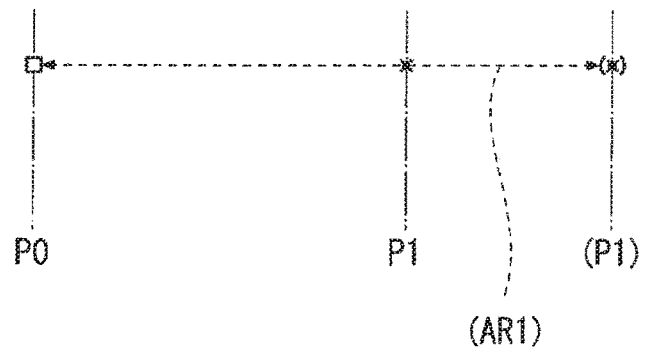
Figure 5C:
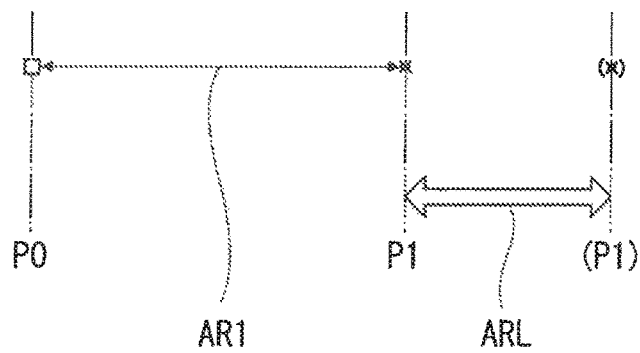

FIG. 1 is a schematic diagram for explaining a first step of the robot diagnosing method according to Embodiment 1 of the present invention. FIG. 1A is a plan view. FIG. 1B is a side view when a work and an end effector are viewed from the robot. FIGS. 2A and 2B are schematic diagrams for explaining a second step of the robot diagnosing method. FIGS. 3A and 3B are schematic diagrams for explaining third and fourth steps of the robot diagnosing method. FIGS. 4A and 4B are schematic diagrams for explaining fifth and sixth steps of the robot diagnosing method. FIGS. 5A to 5C are schematic diagrams for explaining the fourth to sixth steps of the robot diagnosing method. FIG. 5A is a partial plan view. FIG. 5B is a diagram showing a relation among center positions in the fourth step. FIG. 5C is a diagram showing the relation among the center positions in the fifth and sixth steps.

First Step

As shown in FIG. 1, first performed is the first step of preparing a robot 10, a semiconductor wafer W, and a prealigner 60 in a clean room that is a semiconductor manufacturing site. The semiconductor wafer W is conveyed by the robot 10, and the prealigner 60 detects a center position of the semiconductor wafer W.

The robot 10 includes: a robot arm 20 including at least one joint portion AX; an end effector 30 attached to the robot arm 20; and a robot control portion 40 configured to control the robot arm 20 and the end effector 30. The robot 10 according to the present embodiment is a so-called horizontal articulated three-axis robot and includes three joint portions (a first joint portion AX1, a second joint portion AX2, and a third joint portion AX3). The robot 10 further includes a base 12 and a lifting shaft (not shown) provided on an upper surface of the base 12 and extendable in an upward/downward direction. The lifting shaft is configured to be extendable by, for example, an air cylinder (not shown). The robot arm 20 is attached to an upper end portion of the lifting shaft.

The robot arm 20 includes a first arm 20a and a second arm 20b, each of which is constituted by an elongated member extending in a horizontal direction.

The first arm 20a includes one longitudinal end portion attached to the lifting shaft so as to be rotatable around a vertical axis L1. With this, the first joint portion AX1 is configured. The first arm 20a is configured to be rotatable by an electric motor (not shown). The second arm 20b is attached to the other longitudinal end portion of the first arm 20a. The second arm 20b includes one longitudinal end portion attached to the first arm 20a so as to be rotatable around a vertical axis L2. With this, the second joint portion AX2 is configured. The second arm 20b is configured to be rotatable by an electric motor (not shown).

The end effector 30 is attached to the other longitudinal end portion of the second arm 20b so as to be rotatable around a vertical axis L3. With this, the third joint portion AX3 is configured. The end effector 30 is configured to be rotatable by an electric motor (not shown). The end effector 30 includes: an attachment plate 32 attached to an upper surface of the second arm 20a so as to be rotatable; and an end effector main body 34 attached to the attachment plate 32. A tip end of the end effector main body 34 is divided into two parts and is configured to have a Y shape in a plan view. A base end portion of the end effector main body 34 is fixed to the attachment plate 52.

Upward and downward movements of the lifting shaft and rotations of the first arm 20a, the second arm 20b, and the end effector 30 are controlled by the robot control portion 40.

The prealigner 60 includes: a turn table 62 on which the semiconductor wafer W is placed; a driving portion (not shown) configured to rotate the turn table 62; a sensor 64 configured to detect an outer edge portion of the semiconductor wafer W that is being rotated by the driving portion; and a processing portion (not shown) configured to detect a center position of the semiconductor wafer W based on the outer edge portion detected by the sensor 64.

The sensor 64 of the prealigner 60 is, for example, an optical sensor including: a light emitter configured to emit a light ray in a direction from a front paper surface of FIG. 1 to a rear paper surface thereof; and a light receiver configured to receive the light ray emitted from the light emitter. The sensor 64 detects the outer edge portion of the semiconductor wafer W when the light ray received by the light receiver is blocked.

The semiconductor wafer W is a thin plate used in a semiconductor process and is defined as a material of a substrate of a semiconductor device. The shape of the semiconductor wafer W is optional, but the present embodiment explains an example in which the semiconductor wafer W has a circular plate shape.

Second Step

As shown in FIGS. 2A and 2B, next performed is the second step of: rotating the second joint portion AX2 (one joint portion) in an opposite direction to a below-described first direction (i.e., in a leftward direction (counterclockwise direction) in plan views shown in FIGS. 1 and 2A); then placing the semiconductor wafer W on the turn table 62 by the end effector 30; and detecting the center position of the semiconductor wafer W by the prealigner 60.

By rotating the first joint portion AX1 and the third joint portion AX3 according to need when rotating the second joint portion AX2 in the opposite direction to the first direction, postures of the robot arm 20 and the end effector 30 may be set such that the semiconductor wafer W is mountable on the turn table 62. To avoid complicated explanation, the present embodiment explains a case where each of the center position of the semiconductor wafer W detected in the second step and a center position of the end effector 30 coincides with a center position of the turn table 62. However, the present embodiment is not limited to this. To be specific, each of the center position of the semiconductor wafer W and the center position of the end effector 30 does not have to coincide with the center position of the turn table 62.

Third and Fourth Steps

Further performed is the third step of holding by the end effector 30 the semiconductor wafer W placed on the turn table 62. It should be noted that the term "hold" used herein denotes placing the semiconductor wafer W on the upper surface of the end effector 30 and lifting up the semiconductor wafer W. With this, for example, unlike a case where an end effector contacts the outer edge portion of the semiconductor wafer W to chuck and hold the semiconductor wafer W, the center position of the semiconductor wafer W does not move by an operation of holding the semiconductor wafer W. As a result, the deviation amount caused by the lost motion can be detected accurately.

In the present embodiment, after the first to third steps are performed, performed is the fourth step of rotating the second joint portion AX2 in the first direction by a predetermined angle based on a command value from the robot control portion 40 (i.e., in a rightward direction (clockwise direction) in plan views shown in FIGS. 2A and 3A). The states at this time are shown in FIGS. 3A and 3B.

Fifth Step

As shown in FIGS. 4A and 4B, after the first to fourth steps are performed, performed is the fifth step of placing the semiconductor wafer W on the turn table 62 by the end effector 30 and detecting the center position of the semiconductor wafer W again by the prealigner 60.

Sixth Step

Finally performed is the sixth step of detecting the deviation amount caused by the lost motion. The sixth step will be explained in detail based on FIGS. 5A to 5C.

In FIGS. 5A to 5C, a center of the turn table 62 is shown by "□". The center "□" of the turn table is always fixed at a position P0 shown in FIGS. 5B and 5C.

An ideal movement distance based on the command value from the robot control portion 40 in the fourth step is shown by a broken line arrow (AR1) in FIG. 5B. The center of the semiconductor wafer W based on the center of the semiconductor wafer W detected in the second step (which coincides with the center "□" of the turn table in the present embodiment) and the command value (AR1) from the robot control portion 40 in the fourth step is shown by "(●)", and the center of the end effector 30 at this time is shown by "(x)". In FIG. 5A, the semiconductor wafer W having the center position shown by "(●)" and the end effector 30 having the center position shown by "(x)" are shown by broken lines.

In FIG. 5C, the center of the semiconductor wafer W detected in the fifth step is shown by "●", and the center of the end effector 30 at this time is shown by "x". In FIG. 5A, the semiconductor wafer W having the center position shown by "●" and the end effector 30 having the center position shown by "x" are shown by solid lines.

An actual movement distance from the center of the semiconductor wafer W detected in the second step (which coincides with the center "□" of the turn table in the present embodiment as described above) to the center "●" of the semiconductor wafer W detected in the fifth step is shown by a solid line arrow AR1. Further, the deviation amount caused by the lost motion detected based on the centers "(x)" and "x" of the semiconductor wafer W is shown by an outlined arrow ARL in FIG. 5C.

In the present embodiment, since the center "(●)" of the semiconductor wafer W and the center "(x)" of the end effector 30 are located at the same position (P1), they are shown in an overlapping state. Similarly, since the center "." of the semiconductor wafer W and the center "x" of the end effector 30 are located at the same position P1, they are shown in an overlapping state.

As described above, the center position of the semiconductor wafer W detected in the second step is located at the same position P0 as the center "□" of the turn table 62. Ideally, the center position of the semiconductor wafer W moves by the movement distance (AR1) to reach the position (P1) as shown by "(●)". However, actually, the center position of the semiconductor wafer W is located at not the position (P1) but the position P1 by the deviation amount caused by the lost motion at the second joint AX2.

As shown in FIG. 5C, after the first to fifth steps are performed, the deviation amount ARL caused by the lost motion at the second joint portion AX2 can be detected based on (i) the center position (P1) of the semiconductor wafer W based on the center position P0 of the semiconductor wafer W detected in the second step (in the present embodiment, the same position as the center "□" of the turn table 62 which is always fixed) and the command value "(AR1)" from the robot control portion 40 in the fourth step (i.e., a position where "(●)" exists) and (ii) the center position P1 of the semiconductor wafer W detected in the fifth step (i.e., a position where "●" exists). In the present embodiment, the deviation amount ARL caused by the lost motion can be detected by, for example, calculating a difference between a length of the broken line arrow (AR1) shown in FIG. 5B and a length of the solid line arrow AR1 shown in FIG. 5C.

Effects

The robot diagnosing method according to the present embodiment can detect the deviation amount ARL caused by the lost motion at the second joint portion AX2 (one joint portion) based on (i) the center position (P1) of the semiconductor wafer W based on the center position P0 of the semiconductor wafer W (work) detected in the second step and the command value (AR1) from the robot control portion 40 in the fourth step and (ii) the center position P1 of the semiconductor wafer W detected in the fifth step. As a result, the robot diagnosing method according to the present embodiment can detect, by a simple procedure, the deviation amount caused by the lost motion.

Further, in the robot diagnosing method according to the present embodiment, the fourth step of rotating the second joint portion AX2 in the first direction by a predetermined angle based on the command value (AR1) from the robot control portion 40 is performed after the first to third steps are performed. With this, for example, unlike Embodiment 2 described below, the postures of the robot arm 20 and the end effector 30 do not have to be returned to predetermined home postures. Therefore, the effects of the present invention can be made significant.

Furthermore, in the present embodiment, the first direction in which the second joint portion AX2 (one joint portion) rotates in the fourth step is opposite to a direction in which the second joint portion AX2 rotates immediately before placing the semiconductor wafer W on the turn table 62 in the second step. With this, for example, the maximum deviation amount caused by backlash at the second joint portion AX2 can be accurately detected.

Then, in the first step of the robot diagnosing method according to the present embodiment, the semiconductor wafer W, the robot 10, and the prealigner 60 are prepared in the clean room that is the semiconductor manufacturing site. With this, without moving the semiconductor wafer W, the robot 10, and the prealigner 60 from the clean room that is the semiconductor manufacturing site to outside, the deviation amount caused by the lost motion can be detected in the clean room. Therefore, the effects of the present invention can be made significant.

2. Embodiment 2

The robot diagnosing method according to Embodiment 2 of the present invention will be explained based on FIGS. 6A to 10B. As with Embodiment 1, the robot diagnosing method according to the present embodiment detects the deviation amount caused by the lost motion in the robot configured to perform operations with respect to the semiconductor wafer in the clean room that is the semiconductor manufacturing site. In the present embodiment, the devices and the like prepared in the first step are the same as those of Embodiment 1. Therefore, the same reference signs are used for the same components, and a repetition of the same explanation is avoided. Further, explanations of the steps executed in the same manner as Embodiment 1 will not be repeated suitably.

Figures 6A, 6B:
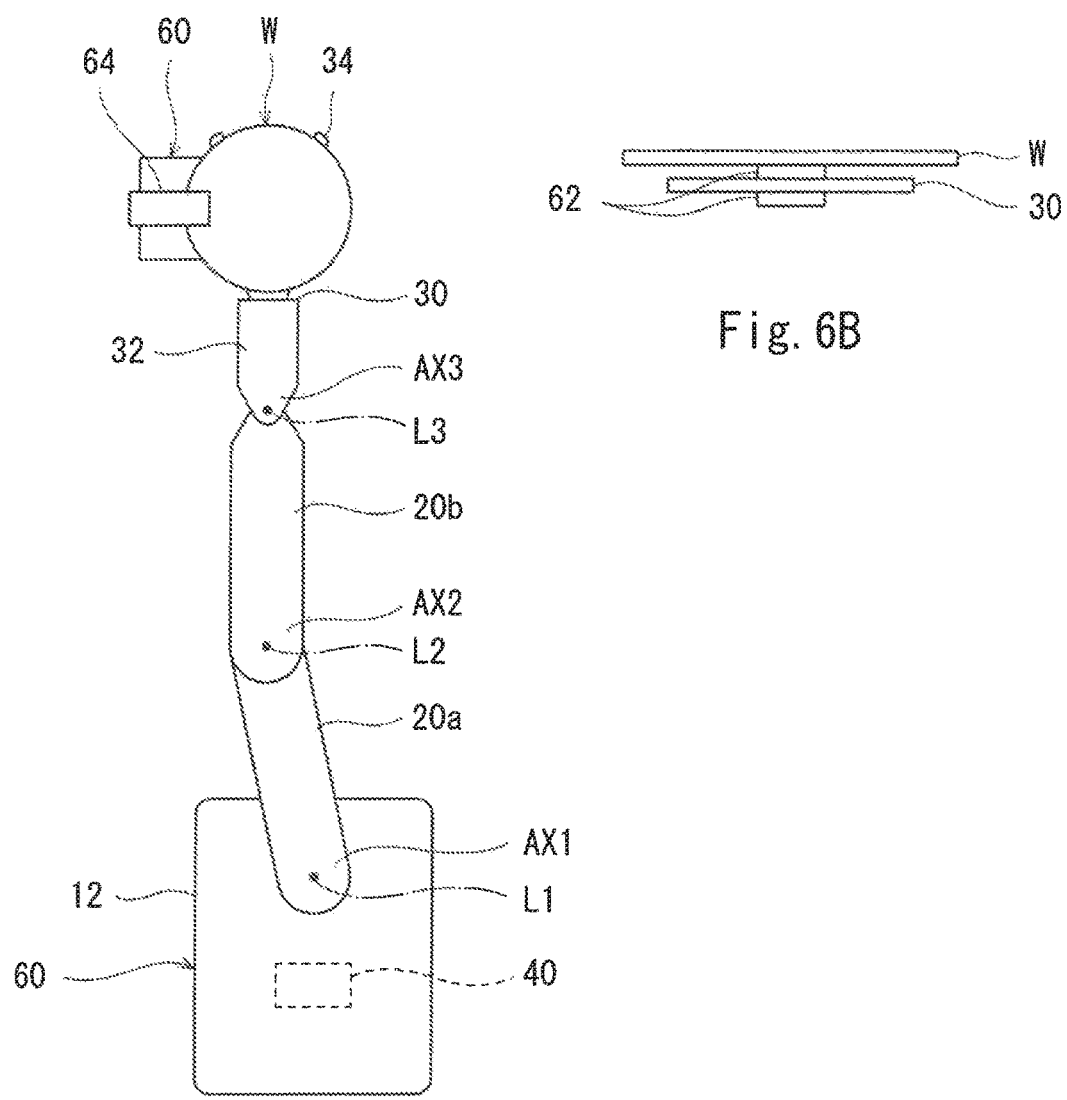
FIGS. 6A and 6B are schematic diagrams for explaining the second step of the robot diagnosing method according to Embodiment 2 of the present invention.
Figure 7B:
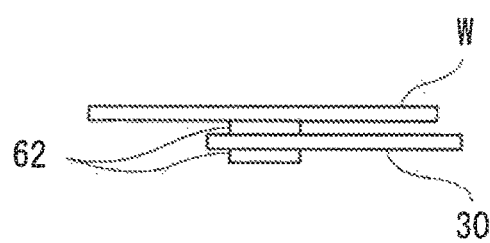
FIGS. 7A and 7B are schematic diagrams for explaining the fourth step of the robot diagnosing method according to Embodiment 2 of the present invention.
Figure 7A:
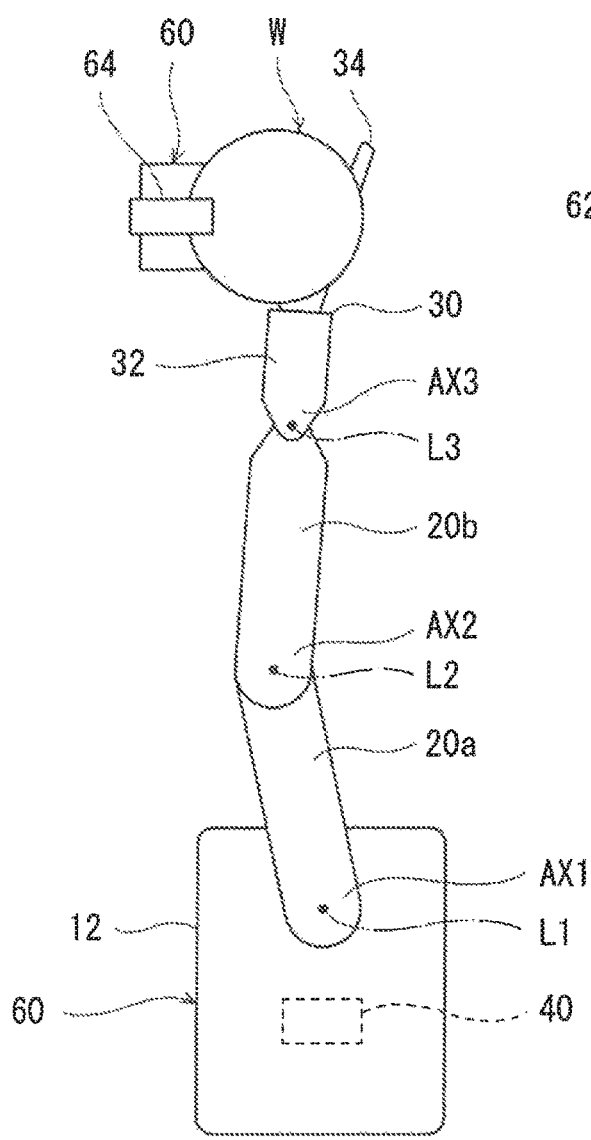
Figures 8A, 8B:
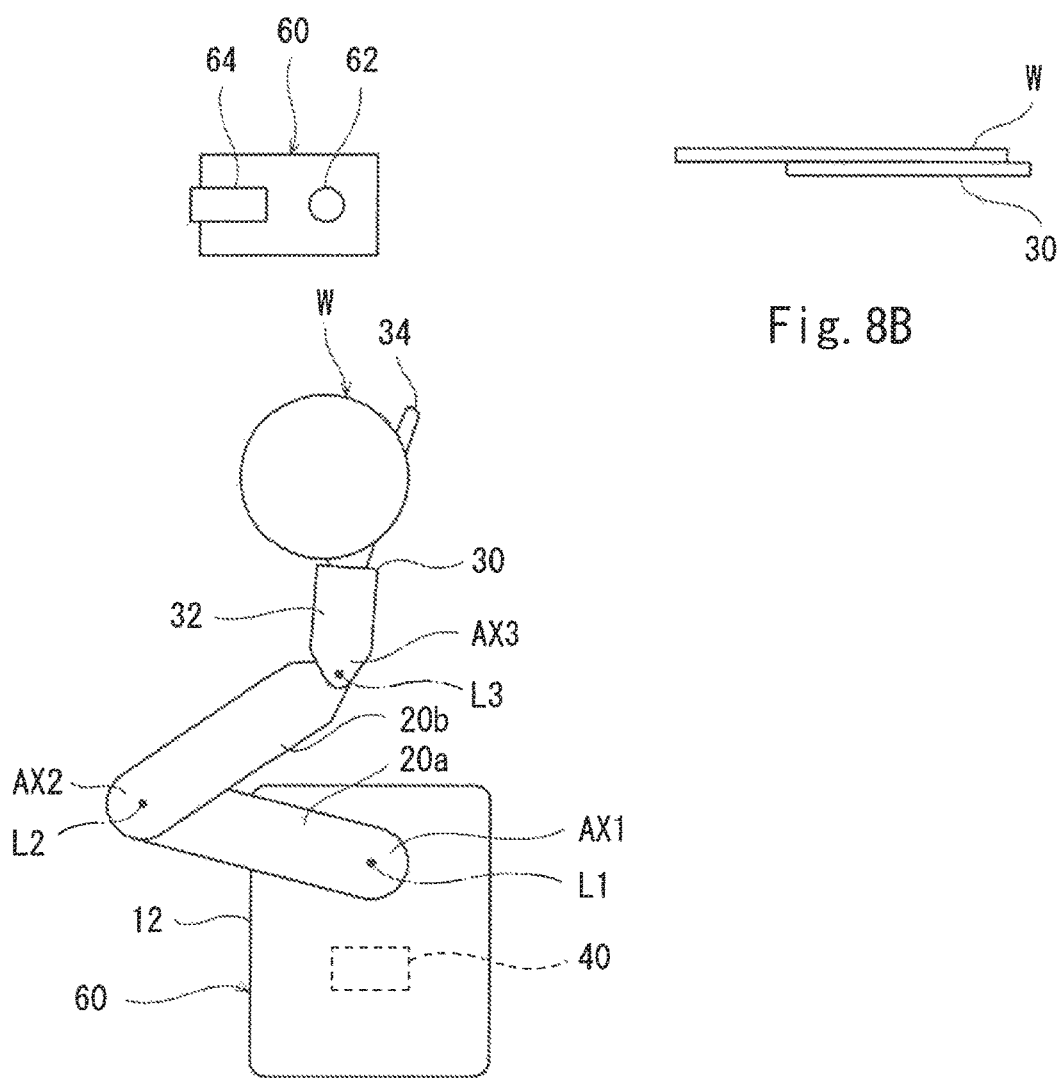
FIGS. 8A and 8B are schematic diagrams for explaining a state where components are returned to home postures in the fifth step of the robot diagnosing method according to Embodiment 2 of the present invention.
Figures 9A, 9B:
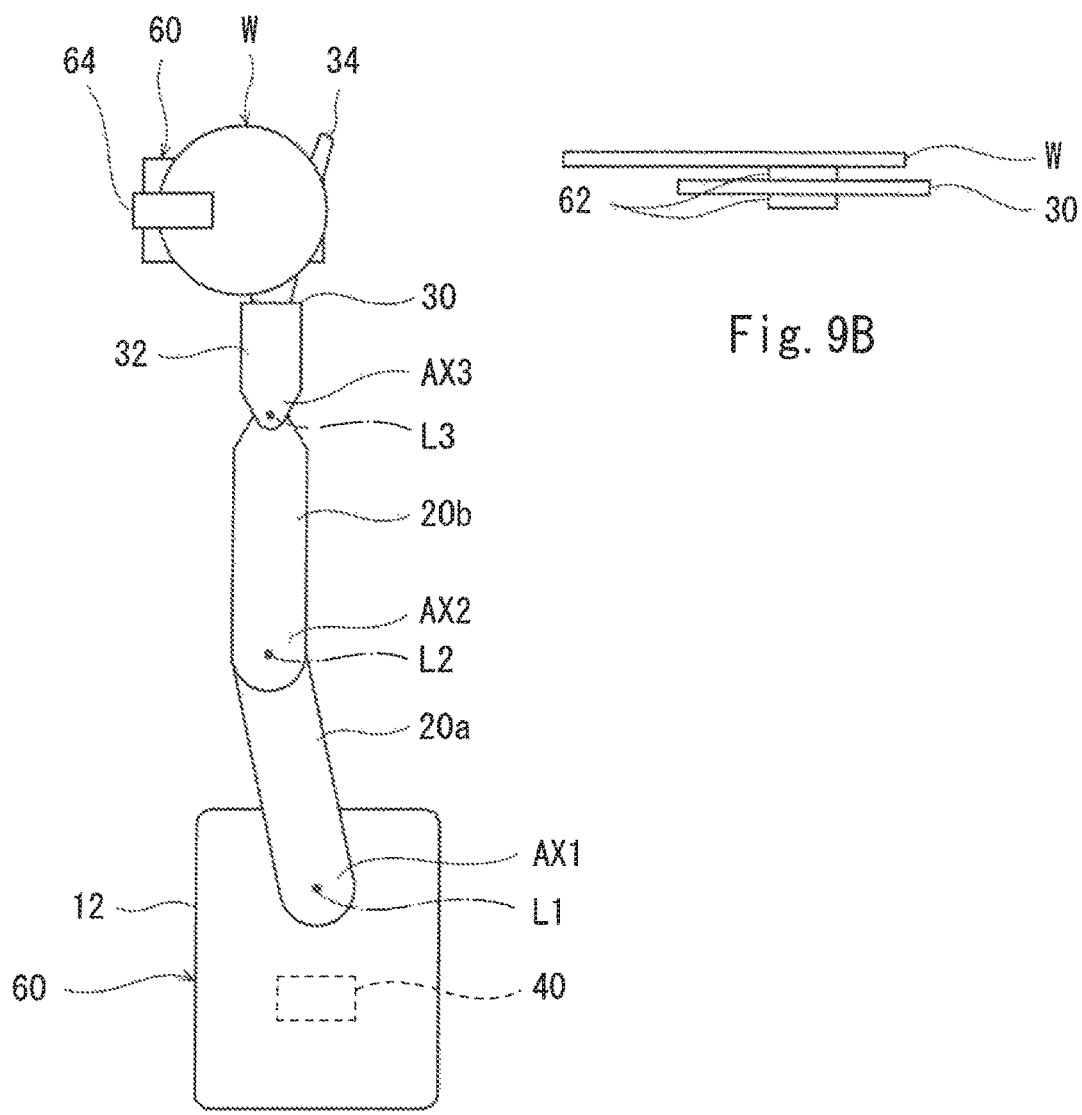
FIGS. 9A and 9B are schematic diagrams for explaining the fifth and sixth steps of the robot diagnosing method according to Embodiment 2 of the present invention.
Figure 10A:
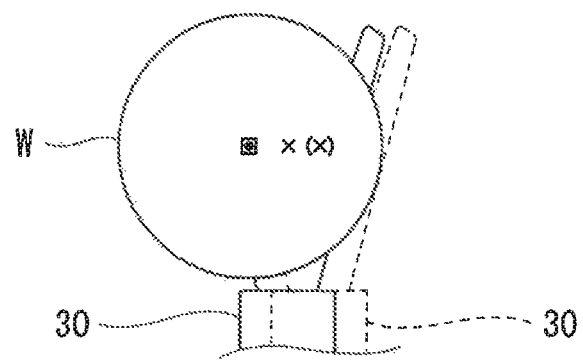
FIGS. 10A and 10B are schematic diagrams for explaining the fourth step among the fourth to sixth steps of the robot diagnosing method according to Embodiment 2 of the present invention.
Figure 10B:
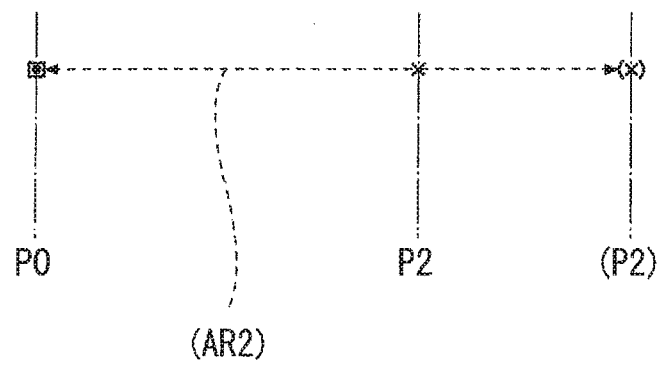
Figure 11A:
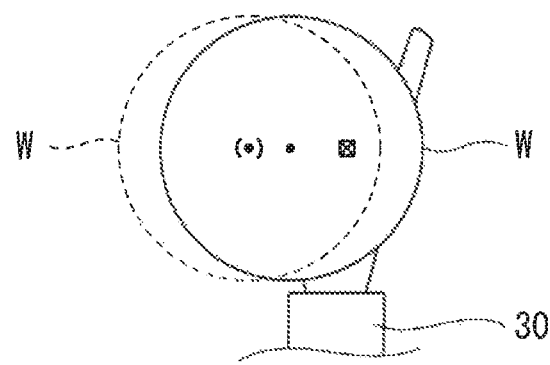
FIGS. 11A and 11B are schematic diagrams for explaining the fifth and sixth steps among the fourth to sixth steps of the robot diagnosing method according to Embodiment 2 of the present invention.
Figure 11B:
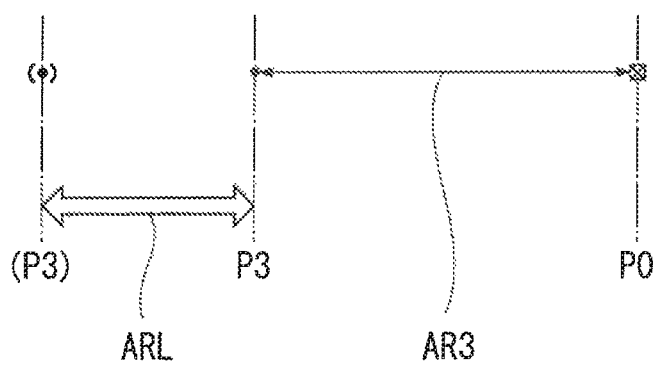

FIGS. 6A and 6B are schematic diagrams for explaining the second step of the robot diagnosing method according to Embodiment 2 of the present invention. FIG. 6A is a plan view. FIG. 6B is a side view when the work and the end effector are viewed from the robot. FIGS. 7A and 7B are schematic diagrams for explaining the fourth step of the robot diagnosing method. FIGS. 8A and 8B are schematic diagrams for explaining a state where components are returned to home postures in the fifth step of the robot diagnosing method. FIGS. 9A and 9B are schematic diagrams for explaining the fifth and sixth steps of the robot diagnosing method. FIGS. 10A and 10B are schematic diagrams for explaining the fourth step among the fourth to sixth steps of the robot diagnosing method. FIG. 10A is a partial plan view. FIG. 10B is a diagram showing the relation among the center positions. FIGS. 11A and 11B are schematic diagrams for explaining the fifth and sixth steps among the fourth to sixth steps of the robot diagnosing method. FIG. 11A is a partial plan view. FIG. 11B is a diagram showing the relation among the center positions.

First Step

As with Embodiment 1, first performed is the first step of preparing the robot 10, the semiconductor wafer W, and the prealigner 60 in the clean room that is the semiconductor manufacturing site. The semiconductor wafer W is conveyed by the robot 10, and the prealigner 60 detects the center position of the semiconductor wafer W. Since detailed structures and the like of the robot 10, the semiconductor wafer W, and the prealigner 60 are the same as those of Embodiment 1, a repetition of the same explanation is avoided.

Second Step

As with Embodiment 1, next performed is the second step of: rotating the second joint portion AX2 (one joint portion) in the opposite direction to the first direction; then placing the semiconductor wafer W on the turn table 62 by the robot arm 20 and the end effector 30; and detecting the center position of the semiconductor wafer W by the prealigner 60. FIGS. 6A and 6B show a state after the second step is performed. As with Embodiment 1, to avoid complicated explanation, the present embodiment explains a case where each of the center position of the semiconductor wafer W detected in the second step and the center position of the end effector 30 coincides with the center position of the turn table 62. However, the present embodiment is not limited to this.

Third and Fourth Steps

According to the present embodiment, unlike Embodiment 1, the third step is performed after the first, second, and fourth steps are performed. To be specific, after the first and second steps are performed, performed is the fourth step of rotating the second joint portion AX2 in the first direction (i.e., in the rightward direction (clockwise direction) in FIGS. 6A and 7A) by a predetermined angle based on the command value from the robot control portion 40. FIGS. 7A and 7B show a state after the fourth step is performed before the third step is performed. After the fourth step is performed, performed is the third step of holding by the end effector 30 the semiconductor wafer W placed on the turn table 62.

Fifth Step

According to the present embodiment, in the fifth step performed after the first, second, fourth, and third steps are performed in this order, the end effector 30 is returned to the same position as when the end effector 30 places the semiconductor wafer W on the turn table 62 in the second step. To realize this, for example, as shown in FIG. 8A, the robot arm 20 and the end effector 30 are returned to predetermined home postures. The term "home posture" denotes such a posture that when the posture of each of the robot arm 20 and the end effector 30 is changed based on the command value from the robot control portion 40 after it is returned to the home posture, the ideal motion based on the command value can be performed without causing the deviation amount. With this, by returning to the home postures as shown in FIG. 8A, the center position of the end effector 30 and the center position of the turn table 62 can be caused to coincide with each other again without causing the deviation amount as shown in FIGS. 9A and 9B as with the state in the second step. At this time, as shown in FIG. 9B, the center position of the semiconductor wafer W deviates leftward from the center position of the turn table 62 and the center position of the end effector 30. Then, in the fifth step, after the robot arm 20 and the end effector 30 are returned to the predetermined home postures as described above, the semiconductor wafer W is placed on the turn table 62, and the center position of the semiconductor wafer W is detected by the prealigner 62 again.

Sixth Step

Finally performed is the sixth step of detecting the deviation amount caused by the lost motion. The sixth step will be explained in detail based on FIGS. 10A, 10B, 11A and 11B.

FIGS. 10A and 10B are diagrams showing the relation among the centers after the fourth step is performed. In FIGS. 10A and 10B, the center of the turn table 62 is shown by "☐". As with Embodiment 1, the center "☐" of the turn table is always fixed at the position P0 shown in FIG. 10B.

An ideal movement distance based on the command value from the robot control portion 40 in the fourth step is shown by a broken line arrow (AR2) in FIG. 10B. The center of the end effector 30 after the fourth step based on the center of the semiconductor wafer W detected in the second step (which coincides with the center "☐" of the turn table in the present embodiment) and the command value (AR2) from the robot control portion 40 in the fourth step is shown by "(x)" in FIG. 10B. It should be noted that in the present embodiment, before performing the third step of holding the semiconductor wafer W by the end effector 30, the end effector 30 is moved by rotating the second joint portion AX2 of the robot arm 20 based on the command value from the robot control portion 40, so that the semiconductor wafer W is not conveyed in a state after the fourth step is performed. In FIG. 10A, the semiconductor wafer W having the center position shown by "●" and the end effector 30 having the center position shown by "x" are shown by solid lines. Further, the end effector 30 having the center position shown by "(x)" is shown by broken lines.

FIGS. 11A and 11B are diagrams showing the relation among the centers after the fifth step is performed. In FIGS. 11A and 11B, the center "n" of the turn table is always fixed at the position P0 shown in FIG. 11B, as with FIGS. 12A and 12B.

In FIGS. 11A and 11B, the center of the semiconductor wafer W detected in the fifth step is shown by "●", and the center of the end effector 30 at this time is shown by "x". After the robot arm 20 and the end effector 30 are returned to the home postures, the center "x" of the end effector 30 is moved to the target position that is the center "☐" of the turn table 62. Therefore, the center "x" of the end effector 30 coincides with the center "☐" of the turn table 62 without causing the deviation amount. In FIG. 11A, the semiconductor wafer W having the center position shown by "●" and the end effector 30 having the center position shown by "x" are shown by solid lines. Further, the semiconductor wafer W having the center position shown by "(●)" is shown by broken lines.

An actual movement distance from the center of the semiconductor wafer W detected in the second step (which coincides with the center "☐" of the turn table in the present embodiment as described above) to the center "●" of the semiconductor wafer W detected in the fifth step is shown by a solid line arrow AR3. Further, the deviation amount caused by the lost motion detected based on the center positions "(x)" and "x" of the semiconductor wafer W is shown by an outlined arrow ARL in FIG. 11B.

As shown in FIGS. 10B and 11B, after the first to fifth steps are performed, the deviation amount ARL caused by the lost motion at the second joint portion AX2 can be detected based on (i) the center position (P3) of the semiconductor wafer W based on the center position P0 of the semiconductor wafer W detected in the second step (in the present embodiment, the same position as the center "□" of the turn table 62 which is always fixed) and the command value "(AR1)" from the robot control portion 40 in the fourth step (i.e., a position where "(●)" exists in FIG. 11B) and (ii) the center position P3 of the semiconductor wafer W detected in the fifth step (i.e., a position where "●" exists in FIG. 11B). In the present embodiment, the deviation amount ARL caused by the lost motion can be detected by, for example, calculating a difference between a length of the broken line arrow (AR2) shown in FIG. 10B and a length of the solid line arrow AR3 shown in FIG. 11B.

Effects

Since the effects of the robot diagnosing method according to the present embodiment are the same as those of Embodiment 1, a repetition of the same explanation is avoided.

3. Embodiment 3

The robot diagnosing method according to Embodiment 3 of the present invention will be explained based on FIGS. 12 and 13. As with Embodiments 1 and 2, the robot diagnosing method according to the present embodiment detects the deviation amount caused by the lost motion in the robot configured to perform operations with respect to the semiconductor wafer in the clean room that is the semiconductor manufacturing site. In the present embodiment, the same reference signs are used for the same components as in Embodiments 1 and 2, and a repetition of the same explanation is avoided. Further, explanations of the same procedures as in Embodiments 1 and 2 will not be repeated suitably.

Figure 12:
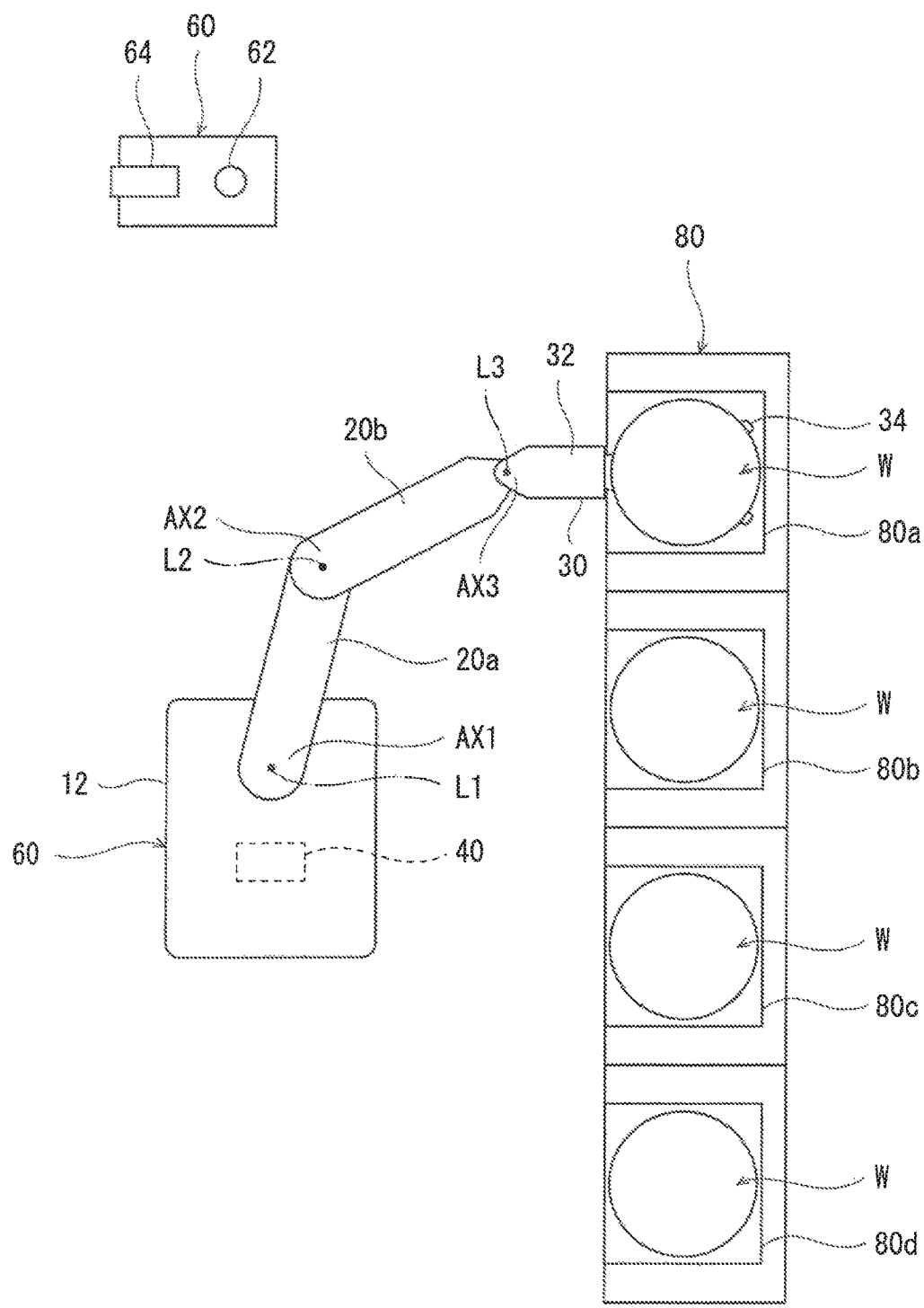
FIG. 12 is a schematic diagram for explaining the robot diagnosing method according to Embodiment 3 of the present invention and is a plan view when postures of a robot arm and the end effector are set such that the work can be accommodated in an accommodating portion.
Figure 13:
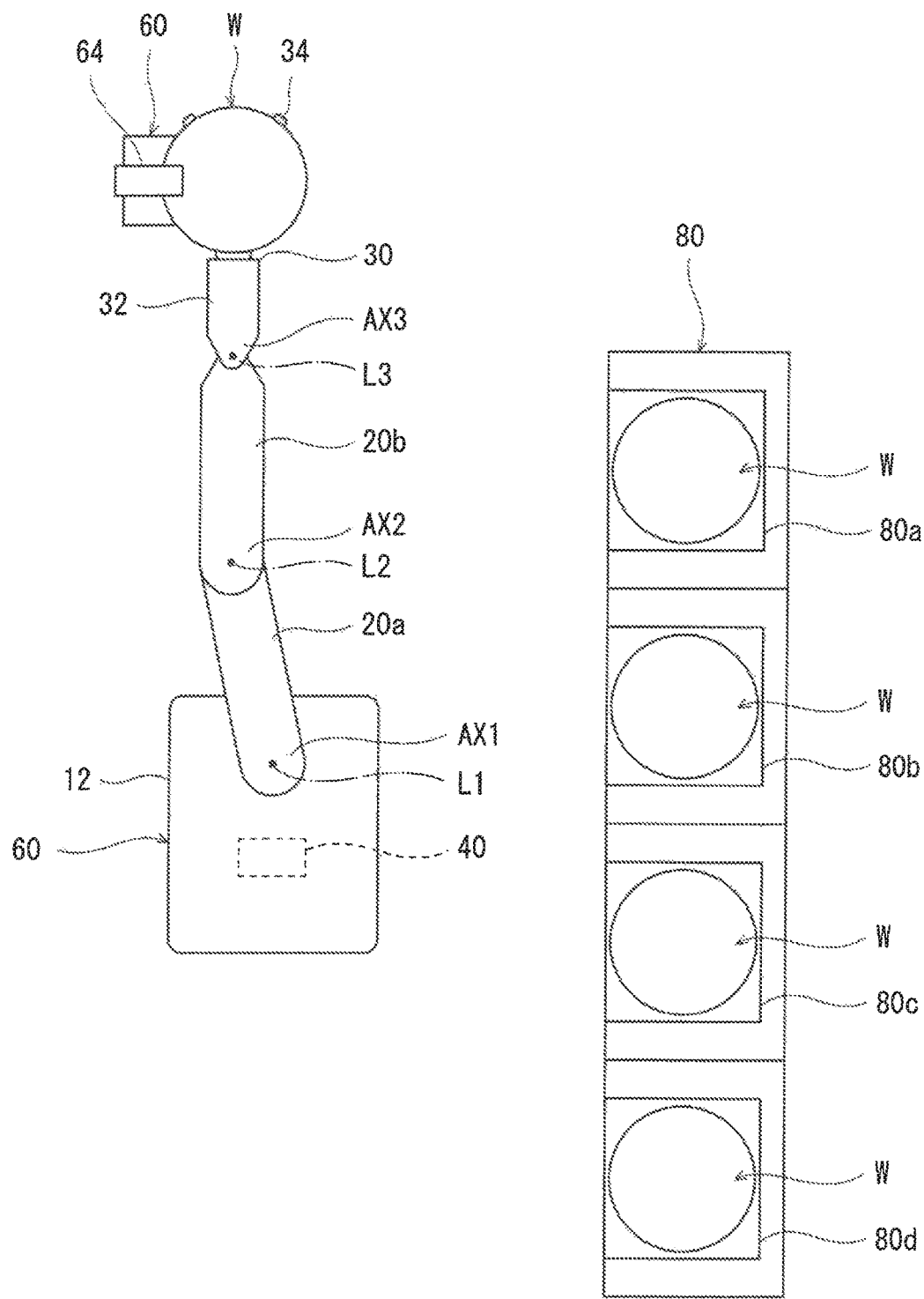
FIG. 13 is a schematic diagram for explaining the robot diagnosing method according to Embodiment 3 of the present invention and is a plan view when the postures of the robot arm and the end effector are set such that the work can be placed on a turn table.

FIG. 12 is a schematic diagram for explaining the robot diagnosing method according to Embodiment 3 of the present invention and is a plan view when postures of the robot arm and the end effector are set such that the work is accommodatable in an accommodating portion. FIG. 13 is a plan view when the postures of the robot arm and the end effector are set such that the work is placeable on a turn table.

First Step

In the first step of the present embodiment, an accommodating portion 80 configured to accommodate the semiconductor wafer W is further prepared in addition to the robot 10, the semiconductor wafer W, and the prealigner 60 prepared in Embodiments 1 and 2. The accommodating portion 80 includes a first accommodating portion 80a, a second accommodating portion 80b, a third accommodating portion 80c, and a fourth accommodating portion 80d arranged adjacent to one another. The semiconductor wafers W are accommodated in the first accommodating portion 80a, the second accommodating portion 80b, the third accommodating portion 80c, and the fourth accommodating portion 80d in advance.

Second Step

In the second step according to the present embodiment, the postures of the robot arm 20 and the end effector 30 are set by a predetermined first motion such that the semiconductor wafer W accommodated in the first accommodating portion 80a is holdable by the end effector 30, and the end effector 30 then holds the semiconductor wafer W. The state at this time is shown in FIG. 12. From this state, the postures of the robot arm 20 and the end effector 30 are set by a predetermined second motion such that the semiconductor wafer W is placeable on the turn table 62. After that, the semiconductor wafer W is placed on the turn table 62, and the prealigner 60 detects the center position of the semiconductor wafer W. The state at this time is shown in FIG. 13.

In the present embodiment, in the fourth step performed after the first to third steps are performed, the end effector 30 holds the semiconductor wafer W placed on the turn table 62, and the postures of the robot arm 20 and the end effector 30 are then set by the predetermined first motion again such that the semiconductor wafer W is accommodatable in the first accommodating portion 80a. In addition, the semiconductor wafer W is accommodated in the first accommodating portion 80a, and the second joint portion AX2 is then rotated in the first direction by a predetermined angle based on the command value from the robot control portion 40.

Fifth Step

In the present embodiment, in the fifth step performed after the fourth step is performed, the end effector 30 holds the semiconductor wafer W accommodated in the first accommodating portion 80a, and the postures of the robot arm 20 and the end effector 30 are set by the predetermined second motion again such that the semiconductor wafer W is placeable on the turn table 62. In addition, the semiconductor wafer W is then placed on the turn table 62, and the prealigner 60 detects the center position of the semiconductor wafer W again.

Sixth Step

In the present embodiment, in the sixth step performed after the first to fifth steps are performed, the deviation amount caused by the lost motion at the second joint portion AX2 when the postures are set such that the semiconductor wafer W is accommodatable in the first accommodating portion 80a is detected based on (i) the center position of the semiconductor wafer W based on the center position of the semiconductor wafer W detected in the second step and the command value from the robot control portion 40 in the fourth step and (ii) the center position of the semiconductor wafer W detected in the fifth step. Since the lost motion can be calculated in the same manner as Embodiment 1, a repetition of the same explanation is avoided.

Effects

By performing the above procedure, the robot diagnosing method according to the present embodiment can detect the deviation amount caused by the lost motion when the postures are set such that the semiconductor wafer W is accommodatable in the first accommodating portion 80a. As shown in FIGS. 12 and 13, when the semiconductor wafers W are accommodated in a plurality of accommodating portions (the first accommodating portion 80a, the second accommodating portion 80b, the third accommodating portion 80c, and the fourth accommodating portion 80c), the deviation amounts caused by the lost motions when the postures are set such that the semiconductor wafers W are accommodatable in the respective accommodating portions are different from one another. Therefore, the effects according to the present embodiment are useful. In Embodiment 3, the deviation amount caused by the lost motion when the postures are set such that the semiconductor wafer W is accommodatable in the first accommodating portion 80a is detected. However, the present embodiment is not limited to this. The deviation amount caused by the lost motion when the postures are set such that the semiconductor wafer W is accommodatable in the second accommodating portion 80b, the third accommodating portion 80c, or the fourth accommodating portion 80c can be detected in the same manner as above.

4. Modified Example

The above embodiment has explained a case where the robot 20, the semiconductor wafer W, the prealigner 60, and the accommodating portion 80 are prepared in the clean room that is the semiconductor manufacturing site. However, the above embodiment is not limited to this. To be specific, the robot 20, the semiconductor wafer W, the prealigner 60, and the accommodating portion 80 may be prepared at a different place. In this case, the work may be a work other than the semiconductor wafer W.

The above embodiment has explained a case of detecting the deviation amount caused by the lost motion at the first joint portion AX1. However, the deviation amount caused by the lost motion at the second joint portion AX2 or the third joint portion AX3 can also be detected by the same procedure as above. Further, the present invention is also applicable to robots including one axis, two axes, or four or more axes.

From the foregoing explanation, many modifications and other embodiments of the present invention are obvious to one skilled in the art. Therefore, the foregoing explanation should be interpreted only as an example and is provided for the purpose of teaching the best mode for carrying out the present invention to one skilled in the art. The structures and/or functional details may be substantially modified within the scope of the present invention.

What is claimed is:

1. A robot diagnosing method of detecting a deviation amount caused by a lost motion,
the robot diagnosing method comprising:
 a first step of preparing
  a robot including a robot arm having at least one joint portion, an end effector attached to the robot arm, and a robot control portion configured to control the robot arm and the end effector,
  a work conveyed by the robot, and
  a prealigner including a turn table on which the work is placed, a driving portion configured to rotate the turn table, a sensor configured to detect an outer edge portion of the work that is being rotated by the driving portion, and a processing portion configured to detect a center position of the work based on the outer edge portion detected by the sensor;
 a second step of placing the work on the turn table by the end effector and detecting the center position of the work by the prealigner;
 a third step of, after at least the first and second steps are performed, holding by the end effector the work placed on the turn table;
 a fourth step of, after at least the first and second steps are performed, rotating one of the at least one joint portion in a first direction by a predetermined angle based on a command value from the robot control portion;
 a fifth step of, after the first to fourth steps are performed, placing the work on the turn table by the end effector and detecting the center position of the work again by the prealigner; and
 a sixth step of, after the first to fifth steps are performed, detecting the deviation amount caused by the lost motion at the one joint portion based on (i) the center position of the work based on the center position of the work detected in the second step and the command value from the robot control portion in the fourth step and (ii) the center position of the work detected in the fifth step.

2. The robot diagnosing method according to claim 1, wherein the fourth step is performed after the first to third steps are performed.

3. The robot diagnosing method according to claim 1, wherein:
 the third step is performed after the first, second, and fourth steps are performed; and
 in the fifth step, the end effector is returned to the same position as when the end effector places the work on the turn table in the second step, and the end effector then places the work on the turn table.

4. The robot diagnosing method according to claim 2, wherein:
 in the first step, an accommodating portion configured to accommodate the work is further prepared;
 in the second step,
  postures of the robot arm and the end effector are set by a predetermined first motion such that the work accommodated in the accommodating portion is holdable by the end effector,
  the end effector holds the work,
  the postures of the robot arm and the end effector are set by a predetermined second motion such that the work is placeable on the turn table,
  the work is then placed on the turn table, and
  the prealigner detects the center position of the work;
 in the fourth step performed after the first to third steps are performed,
  the postures of the robot arm and the end effector are set by the predetermined first motion such that the work is accommodatable in the accommodating portion,
  the work is accommodated in the accommodating portion, and
  one of the at least one joint portion is then rotated in the first direction by a predetermined angle based on the command value from the robot control portion;
 in the fifth step performed after the fourth step is performed,
  the end effector holds the work accommodated in the accommodating portion,
  the postures of the robot arm and the end effector are set by the predetermined second motion such that the work is placeable on the turn table,
  the work is then placed on the turn table, and
  the prealigner detects the center position of the work again; and
 in the sixth step performed after the first to fifth steps are performed, the deviation amount caused by the lost motion at the one joint portion when the postures are set such that the work is accommodatable in the accommodating portion is detected based on (i) the center position of the work based on the center position of the work detected in the second step and the command value from the robot control portion in the fourth step and (ii) the center position of the work detected in the fifth step.

5. The robot diagnosing method according to claim 1, wherein the first direction in which the one joint portion is rotated in the fourth step is opposite to a direction in which the one joint portion is rotated immediately before the work is placed on the turn table in the second step.

6. The robot diagnosing method according to claim 1, wherein in the first step, the work, the robot, and the prealigner are prepared in a clean room that is a semiconductor manufacturing site.

7. The robot diagnosing method according to claim 6, wherein in the first step, the accommodating portion is prepared in the clean room that is the semiconductor manufacturing site.

8. The robot diagnosing method according to claim 1, wherein the work is a semiconductor wafer.

* * * * *